US006456875B1

(12) United States Patent
Wilkinson et al.

(10) Patent No.: US 6,456,875 B1
(45) Date of Patent: Sep. 24, 2002

(54) CYCLIC REDUNDANCY CALCULATION CIRCUITRY FOR USE IN MEDICAL DEVICES AND METHODS REGARDING SAME

(75) Inventors: Jeffrey D. Wilkinson, Vadnais Heights, MN (US); Kevin K. Walsh, Peoria; Robert W. Hocken, Scottsdale, both of AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 09/416,667

(22) Filed: Oct. 12, 1999

(51) Int. Cl.[7] .......................... H03M 13/09; A61N 1/00
(52) U.S. Cl. .......................... 607/2; 714/799; 714/781; 607/31; 607/60; 607/32
(58) Field of Search ................... 714/781, 799, 714/807, 758; 607/31, 32, 2, 30, 60; 128/901, 903, 904

(56) References Cited

U.S. PATENT DOCUMENTS

| 3,678,469 A | | 7/1972 | Freeman et al. ......... 340/172.5 |
|---|---|---|---|
| 4,282,551 A | * | 8/1981 | Kanazawa et al. ............ 360/32 |
| 4,379,459 A | | 4/1983 | Stein ........................... 128/419 |
| 4,476,868 A | | 10/1984 | Thompson ................... 128/419 |
| 4,556,063 A | | 12/1985 | Thompson ................... 128/419 |
| 4,821,723 A | | 4/1989 | Baker, Jr. et al. ............ 128/419 |
| 5,127,404 A | | 7/1992 | Wyborny et al. ............ 128/419 |
| 5,131,388 A | | 7/1992 | Pless et al. .................. 128/419 |
| 5,144,949 A | | 9/1992 | Olson .......................... 128/419 |
| 5,158,078 A | | 10/1992 | Bennett et al. .............. 128/419 |
| 5,199,428 A | | 4/1993 | Obel et al. ................... 128/419 |
| 5,207,218 A | | 5/1993 | Carpentier et al. .......... 128/419 |
| 5,312,453 A | | 5/1994 | Shelton et al. ................. 607/19 |
| 5,314,430 A | | 5/1994 | Bardy ............................ 607/5 |
| 5,330,507 A | | 7/1994 | Schwartz ...................... 607/14 |
| 5,331,966 A | | 7/1994 | Bennett et al. .............. 128/696 |
| 5,354,316 A | | 10/1994 | Keimel ......................... 607/15 |
| 5,354,319 A | | 10/1994 | Wyborny et al. .............. 607/32 |
| 5,545,186 A | | 8/1996 | Olson et al. ................... 607/14 |
| 5,768,296 A | * | 6/1998 | Langer et al. ............... 714/784 |

\* cited by examiner

Primary Examiner—Kennedy Schaetzle
(74) Attorney, Agent, or Firm—Girma Wolde-Michael

(57) ABSTRACT

Cyclic redundancy calculations are provided by operating on a data stream, e.g., a data stream in an implantable medical device, to perform a polynomial division thereon using one of a first cyclic redundancy code generator polynomial and a second cyclic redundancy code generator polynomial. The first cyclic redundancy code generator polynomial is a higher order polynomial than the second cyclic redundancy code generator polynomial and contains all terms of the second cyclic redundancy code generator polynomial. The polynomial division may be implemented using linear feedback shift register circuitry and circuitry to select between the use of the first or second cyclic redundancy code generator polynomial.

46 Claims, 10 Drawing Sheets

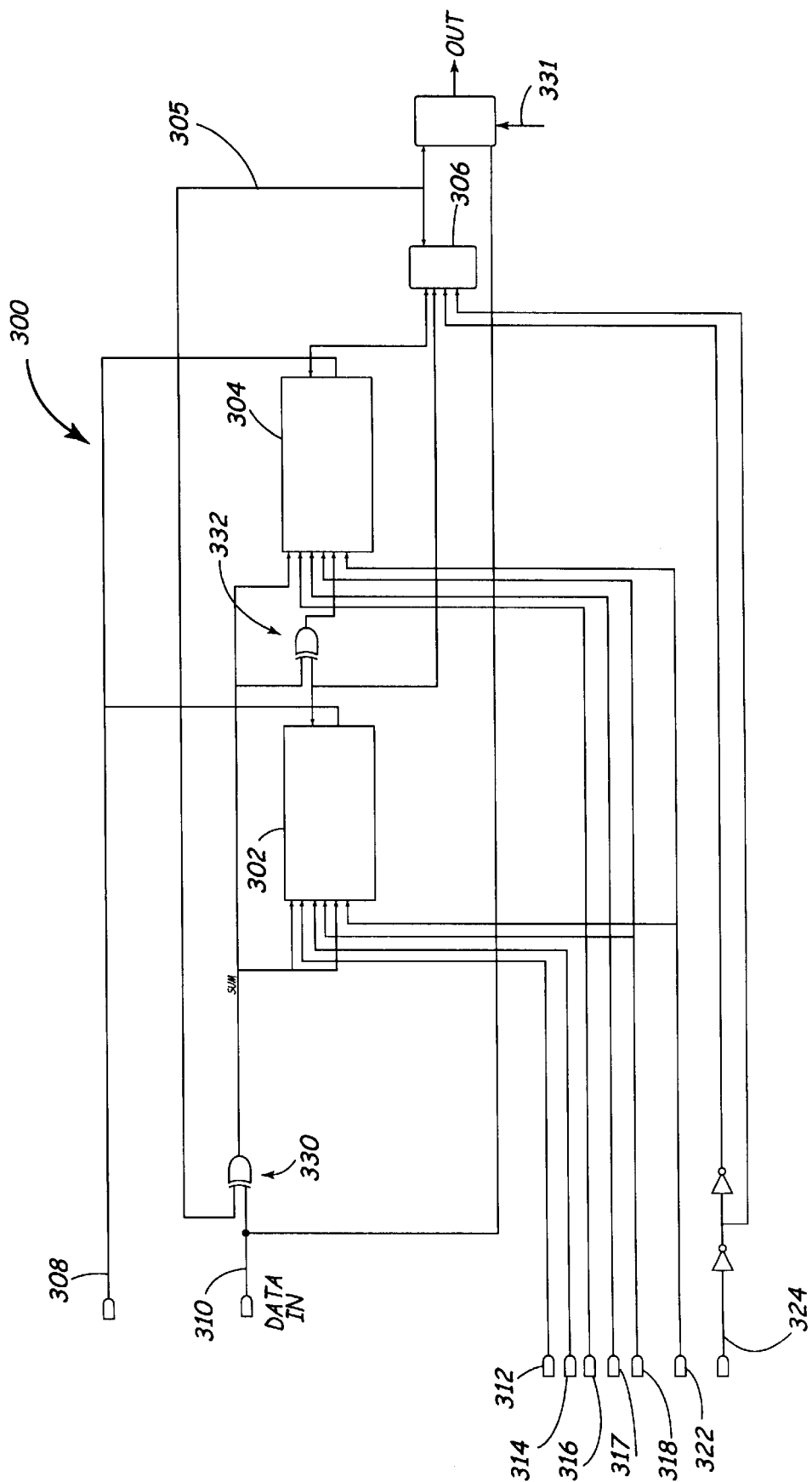

CYCLIC REDUNDANCY CALCULATION CIRCUITRY FOR USE IN MEDICAL DEVICES AND METHODS REGARDING SAME

FIELD OF THE INVENTION

The present invention relates to cyclic redundancy calculation circuitry. More particularly, the present invention pertains to generator polynomials for use in cyclic redundancy calculations, such as, for example, those performed for use in error detection in implantable medical devices.

BACKGROUND OF THE INVENTION

Various devices use cyclic redundancy checking for error detection. For example, as described in U.S. Pat. No. 5,354,319 to Wyborny et al., issued Oct. 11, 1994 and entitled "Telemetry System for an Implantable Medical Device," cyclic redundancy checking is used for link error detection in the communication of information between an implantable device to an external receiver. Further, other types of transmission and/or storage devices use cyclic redundancy checking for error detection purposes. For example, digital cellular systems transmitting digitized speech data utilize cyclic redundancy checking.

Generally, cyclic redundancy checking techniques must be customized to operate on the type of errors which are expected to be encountered in a particular system design. Inappropriate choice of coding leads to poor error detection, poor correction, and overuse of system resources.

Generally, to perform cyclic redundancy check encoding or decoding for a block of data, a cyclic redundancy check code, i.e., a remainder polynomial, is calculated by system circuitry. To calculate a cyclic redundancy check code, the data to be encoded or decoded is considered as a long polynomial with binary coefficients. The data polynomial is divided by a generator polynomial, g(x), which has been designed for a desired cyclic redundancy checking performance. Only a small number of polynomials are suitable for use as generator polynomials and generally, a smaller number of such generator polynomials exhibit the proper coding performance for a particular system design.

The calculation of cyclic redundancy checking codes is commonly supported with specialized circuitry designed to generate check bits for a particular generator polynomial. For example, communication control integrated circuits and microprocessor serial ports often incorporate cyclic redundancy checking calculation hardware to generate a particular standard check bit format. For example, U.S. Pat. No. 5,354,319 to Wyborny et al. describes the design of a 16-bit cyclic redundancy check code generating hardware design.

Calculation of multiple formats, for example, calculation of both the common CRC-16 and CCITT-16 polynomials, requires significant duplication of functions and circuitry. Further, generating multiple codes of different length also generally requires duplication of functions and circuitry. For example, generation of a cyclic redundancy check code that is 8-bits long versus a code that is 16-bits long conventionally has required significant duplication of functions and circuitry.

Attempts have been made at providing cyclic redundancy checking which is capable of operating with use of multiple generator polynomials. For example, U.S. Pat. No. 3,678,469 to Freeman et al., issued Jul. 18, 1972 and entitled "Universal Cyclic Division Circuit," describes a universal cyclic redundancy check generator which stores information about the character size in use and the polynomial to be used for checking data. The stored information is used to control a universal matrix which uses the stored polynomial to generate a cyclic redundancy check code for new data received and combines it with a cumulative cyclic redundancy check character developed by the matrix for previous characters. However, such cyclic redundancy checking designs have generally not taken into consideration the space limitations and low power requirements of low power devices, such as implantable medical devices.

Implantable medical devices are generally designed in view of space limitations and low power requirements. As indicated above, generally, to calculate multiple format cyclic redundancy checking codes, e.g., 8-bit codes and 16-bit codes, in the same system, requires significant duplication of functions and circuitry. Such duplication of functions and circuitry is undesirable, particularly in such low power and space limited applications, e.g., implantable medical devices.

As those of ordinary skill in the art will appreciate readily upon reading the Summary of the Invention, Detailed Description of the Embodiments, and claims set forth below, at least some of the devices and methods disclosed in the references cited herein may benefit advantageously by using the teachings of the present invention. However, listing of any such references in Table 1, or elsewhere herein, is by no means an indication that such references are prior art to the present invention.

SUMMARY OF THE INVENTION

The present invention has certain objects. That is, various embodiments of the present invention provide solutions to one or more problems existing in the prior art with respect to use of cyclic redundancy checking techniques. One of such problems involves the lack of methods and devices for efficiently and effectively calculating cyclic redundancy codes of multiple bit lengths, e.g., such as with use of multiple generator polynomials in polynomial division calculations. Further, for example, other problems include the significant duplication of functions and circuitry to provide calculation of such cyclic redundancy codes, the higher power demands of systems which do not include the flexibility of utilizing cyclic redundancy codes of multiple lengths, e.g., 8-bit codes and 16-bit codes, and the inability to lower the power consumption of such systems.

In comparison to known techniques for providing cyclic redundancy checking, various embodiments of the present invention may provide one or more of the following advantages. For example, sharing of generator polynomial terms when implementing cyclic redundancy checking provides for reduced duplication of circuitry and functionality, e.g., minimal hardware usage to provide cyclic redundancy checking. By providing cyclic redundancy codes using multiple generator polynomials, lower power requirements can also be satisfied.

Some embodiments of the present invention include one or more of the following features: the provision of one or more circuits which implement at least a first and second cyclic redundancy code generator polynomial; implementation of a first cyclic redundancy code generator polynomial which is expressed as a first set of terms and a second cyclic redundancy code generator polynomial which is expressed as a second set of terms, wherein the first code generator polynomial is of a higher order than the second code generator polynomial and contains all of the second set of terms of the second cyclic redundancy code generator polynomial; selection between use of a first and second cyclic redundancy code generator polynomial to perform polynomial division for a data stream resulting in a cyclic redundancy code; implementation of a first and second cyclic redundancy code generator polynomial using a first linear feedback shift register circuit and a second linear feedback shift register circuit; implementation of a first and second linear feedback shift register circuit using latches and XOR gates; providing for selection of a first cyclic redundancy code generator polynomial that results in a 16-bit cyclic redundancy code and a code generator polynomial that results in an 8-bit cyclic redundancy code; performing cyclic redundancy polynomial division on a data stream that includes memory data, e.g., data in a non-volatile memory device, or data communicated between a transmitter and a receiver; performing cyclic redundancy calculations within an implantable medical device; a cyclic redundancy code generator apparatus including one or more circuits operable on one or more data blocks to perform a polynomial division using one of at least a first cyclic redundancy code generator polynomial and a second cyclic redundancy code generator polynomial to generate a cyclic redundancy code; and a cyclic redundancy code generator apparatus including a first linear feedback shift register circuit for receiving data and a second linear feedback shift register circuit serially connected to the first linear feedback shift register circuit, wherein such circuits are configured for providing polynomial division on data using a first cyclic redundancy code generator polynomial and also configured for performing the polynomial division on data using a second cyclic redundancy code generator polynomial.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIG. 6A is an alternate embodiment of cyclic redundancy calculation circuitry shown generally in FIG. 4 according to the present invention.

DETAILED DESCRIPTION OF THE EMBODIMENTS

The present invention shall be described with reference to FIGS. 1–6. Generally, the present invention provides calculation circuitry for performing polynomial division to generate cyclic redundancy check (CRC) codes, e.g., 8-bit and 16-bit CRC codes, for blocks of data using a selected generator polynomial of multiple available generator polynomials. The calculation circuitry is used to encode data or decode encoded data for use in error detection.

Preferably, the multiple generator polynomials available for selection according to the present invention include at least one higher order generator polynomial which is constrained to be expressed as a sum of higher order polynomial terms and a lower order generator polynomial. By constraining the generator polynomials to share low order terms, circuit implementation thereof can be reduced while allowing for flexibility of selecting the use of one of the multiple generator polynomials, e.g., either a higher order or lower order generator polynomial, to achieve a selected length CRC code, i.e., polynomial remainder of the polynomial division performed using the generator polynomial.

Figure 1:
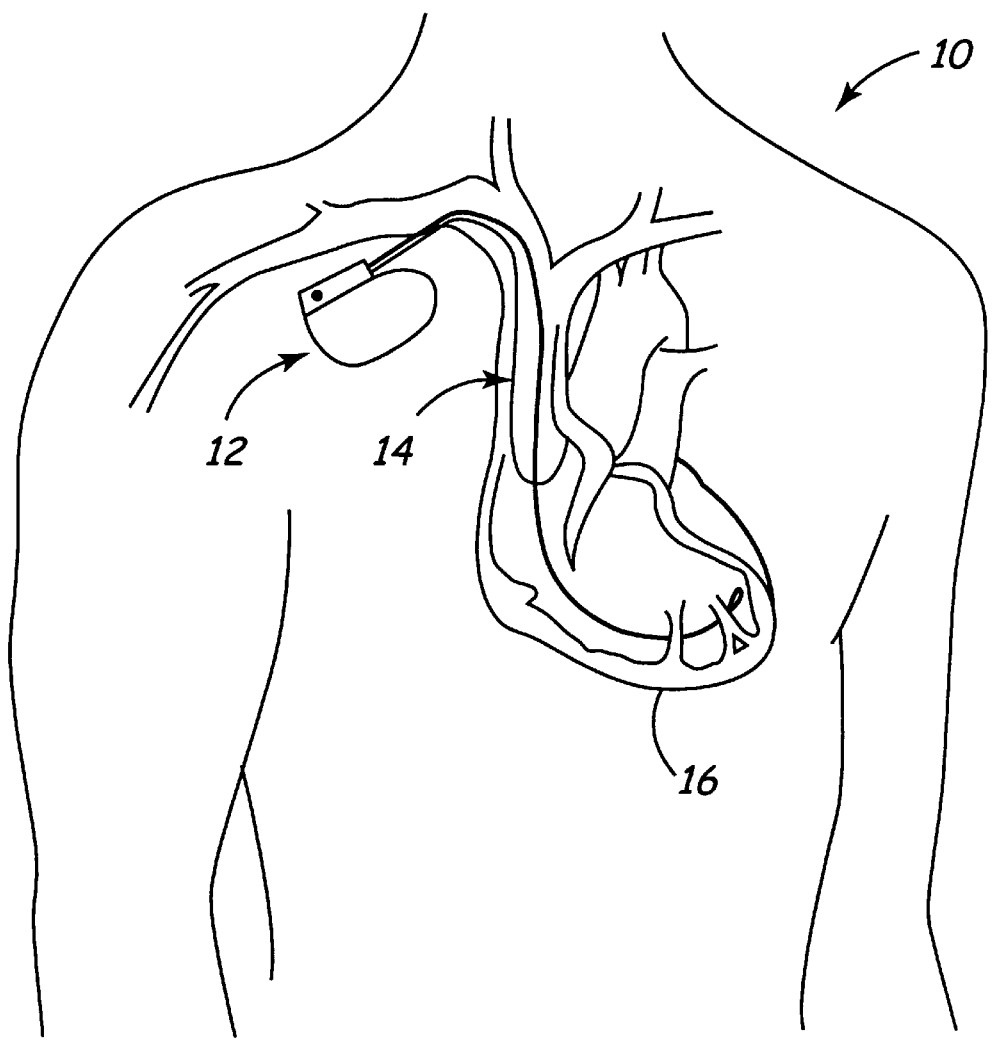
FIG. 1 is a diagram illustrating an implantable medical device in a body, wherein the implantable medical device employs cyclic redundancy calculation circuitry according to the present invention.

FIG. 1 is a simplified schematic view of an implantable medical device 12 employing cyclic redundancy calculation circuitry according to the present invention. The implantable medical device 12 is implanted in a body 10 near a human heart 16. Implanted medical device 12 is electrically connected to the heart by leads 14. In the case where the implanted medical device 12 is a pacemaker, the leads 14 are pacing and sensing leads connected to the heart 16 from the implanted medical device 12. Such leads sense electrical signals attendant to the. depolarization and repolarization of the heart 16 and provide pacing pulses for causing depolarization of cardiac tissue in the vicinity of the distal ends thereof. Implantable medical device 12 may be any implantable cardiac pacemaker such as those disclosed in U.S. Pat. No. 5,158,078 to Bennett et al.; U.S. Pat. No. 5,312,453 to Shelton et al.; or U.S. Pat. No. 5,144,949 to Olson.

Implantable medical device 12 may also be a pacemaker-cardioverter-defibrillator (PCD) corresponding to any of the various commercially-available implantable PCDs. For example, the present invention may be practiced in conjunction with PCDs such as those described in U.S. Pat. No. 5,545,186 to Olson et al.; U.S. Pat. No. 5,354,316 to Keimel; U.S. Pat. No. 5,314,430 to Bardy; U.S. Pat. No. 5,131,388 to Pless; or U.S. Pat. No. 4,821,723 to Baker, et al.

Alternatively, implantable medical device 12 may be an implantable nerve stimulator or muscle stimulator such as that disclosed in U.S. Pat. No. 5,199,428 to Obel et al.; U.S. Pat. No. 5,207,218 to Carpentier et al.; U.S. Pat. No. 5,330,507 to Schwartz; or an implantable monitoring device such as that disclosed in U.S. Pat. No. 5,331,966 issued to Bennett et al.

Further, for example, the implanted medical device 12 may be a defibrillator, a cardioverter-defibrillator, a brain stimulator, a gastric stimulator, a drug pump, a hemodynamic monitoring device, or any other implantable device that would benefit from cyclic redundancy calculation circuitry as described herein. Therefore, the present invention is believed to find wide application in any form of implantable medical device. As such, any description herein making reference to any particular medical device is not to be taken as a limitation of the type of medical device which can benefit from and which can employ cyclic redundancy calculation circuitry as described herein.

Further, although the present invention is particularly described with reference to use of cyclic redundancy checking in implantable medical devices, the present invention is in no manner limited to such applications. For example, the present invention may be used in any application where cyclic redundancy calculation circuitry is beneficial as would be readily apparent to one skilled in the art from the description herein. For example, cyclic redundancy calculation circuitry and methods regarding such circuitry as described herein may be used in telecommunication systems, other data communication systems, or any other application as would readily be apparent to one skilled in the art from the description herein, such as those performing error detection and/or correction.

In general, the implantable medical device 12 may include a hermetically sealed enclosure that may include various elements such as an electrochemical cell (e.g., a lithium battery), circuitry that controls device operations and records rhythmic EGM episodes, telemetry transceiver antenna and circuit that receives downlink telemetry commands from and transmits stored data in a telemetry uplink to an external programmer, etc. Generally, the medical device is implemented with a microprocessor-based architecture. However, electronic features and operations of the implantable medical device may be implemented in discrete logic or as a microcomputer-based system, as would be readily apparent to one skilled in the art.

Figure 2:
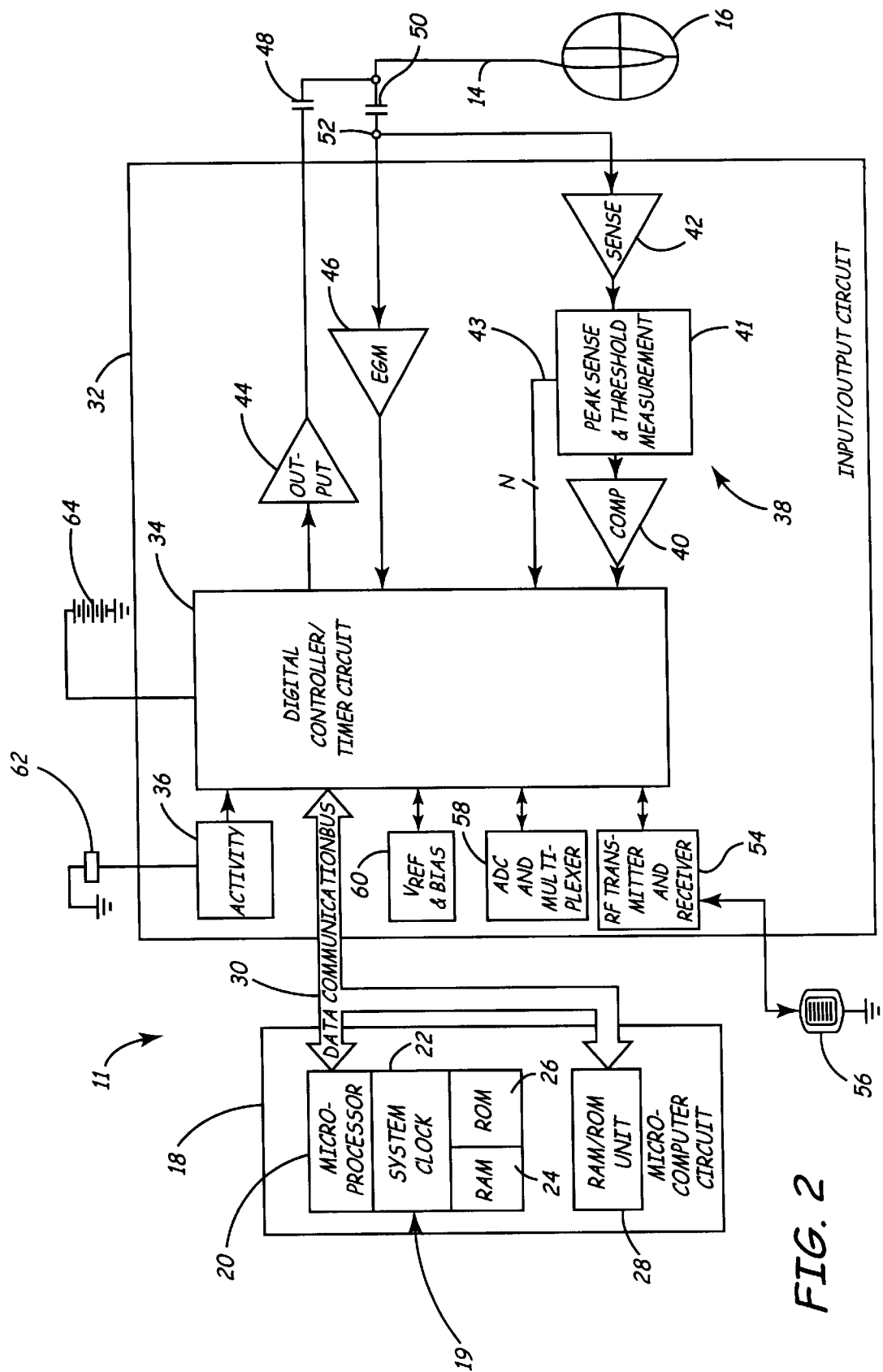
FIG. 2 is a block diagram of circuitry of one embodiment of the implantable medical device of FIG. 1 including cyclic redundancy calculation circuitry according to the present invention.

FIG. 2 shows a block diagram illustrating components of a pacemaker 11 in accordance with one embodiment of the present invention where pacemaker 11 employs cyclic redundancy calculation circuitry according to the present invention. In the illustrative embodiment shown in FIG. 2, the pacemaker 11 is preferably programmable by means of an external programming unit (not shown). One such programmer suitable for the purposes of the present invention is the commercially-available Medtronic Model 9790 programmer. The programmer is a microprocessor based device which provides a series of encoded signals to pacemaker 11 by means of a programming head which transmits radiofrequency (RF) encoded signals to pacemaker 11 according to a telemetry system such as, for example, that described in U.S. Pat. No. 5,127,404 to Wyborny et al. It is to be understood, however, that any programming methodology may be employed so long as the desired information is transmitted to and from the pacemaker 11.

Pacemaker 11 illustratively shown in FIG. 2 is electrically coupled to the patient's heart 16 by lead 14. Lead 14 is coupled to a node 52 in the circuitry of pacemaker 11 through input capacitor 50. In the presently disclosed embodiment, an activity sensor 62 provides a sensor output to an activity circuit 36 of input/output circuit 32. Input/output circuit 32 also contains circuits for interfacing to heart 16, antenna 56, and contains circuits 44 for application of stimulating pulses to heart 16 to control its rate under control of software-implemented algorithms in microcomputer unit 18.

Microcomputer unit 18 preferably comprises on-board circuit 19 that includes microprocessor 20, system clock 22, and on-board random access memory (RAM) 24 and read-only memory (ROM) 26. In this illustrative embodiment, off-board circuit 28 comprises a RAM/ROM unit. According to one embodiment of the present invention, cyclic redundancy checking is applied to data communicated between the microprocessor and the off-board circuit 28 as shown more generally in FIG. 3. On-board circuit 19 and off-board circuit 28 are each coupled by a communication bus 30 to digital controller/timer circuit 34.

The electrical components shown in FIG. 2 are powered by an appropriate implantable battery power source 64 in accordance with common practice in the art. For the sake of clarity, the coupling of battery power to the various components of pacemaker 11 is not shown in the figures.

Antenna 56 is connected to input/output circuit 32 to permit uplink/downlink telemetry through RF transmitter and receiver unit 54. Unit 54 may correspond to the telemetry and program logic disclosed in U.S. Pat. No. 4,556,063 issued to Thompson et al. or to that disclosed in the above-referenced Wyborny et al. patent. The uplink and downlink communication may employ cyclic redundancy checking according to the present invention.

$V_{REF}$ and bias circuit 60 generates a stable voltage reference and bias currents for circuits of input/output circuit 32. Analog to digital converter (ADC) and multiplexer unit 58 digitizes analog signals and voltages to provide "real-time" telemetry intracardiac signals and battery end-of-life (EOL) replacement function.

Operating commands for controlling the timing of pacemaker 11 are coupled by bus 30 to digital controller/timer circuit 34, where digital timers and counters establish the overall escape interval of the pacemaker as well as various refractory, blanking, and other timing windows for controlling the operation of the peripheral components disposed within input/output circuit 32. Digital controller/timer circuit 34 is preferably coupled to sense circuitry 38, including sense amplifier 42, peak sense and threshold measurement unit 41, and comparator/threshold detector 40. Sense amplifier 42 amplifies sensed electrocardiac signals and provides an amplified signal to peak sense and threshold measurement circuitry 41. Circuitry 41 in turn provides an indication of peak sensed voltages and measured sense amplifier threshold voltages on path 43 to digital controller/timer circuit 34. An amplified sense amplifier signal is also provided to comparator/threshold detector 40. Sense amplifier 42 may, for example, correspond to that disclosed in U.S. Pat. No. 4,379,459 to Stein.

Circuit 34 is further preferably coupled to electrogram (EGM) amplifier 46 for receiving amplified process signals sensed by an electrode disposed on lead 14. The electrogram signal provided by EGM amplifier 46 is employed when the implanted device is being interrogated by an external programmer (not shown) to transmit by uplink telemetry a representation of an analog electrogram of the patient's electrical heart activity. Such functionality is, for example, shown in U.S. Pat. No. 4,556,063 to Thompson et al.

Output pulse generator 44 provides pulsing stimuli to the patient's heart 16 through coupling capacitor 48 in response to a pacing trigger signal provided by digital controller/timer circuit 34. Output amplifier 44, for example, may correspond generally to the output amplifier disclosed in U.S. Pat. No. 4,476,868 to Thompson.

According to the present invention, an implantable medical device 12, such as that shown in the illustrative embodiment of the pacemaker 11 in FIG. 2, employs cyclic redundancy calculation circuitry therein. The cyclic redundancy calculation circuitry, used, for example, in error detection and/or error correction, shall be described in further detail below with reference to FIGS. 3–11.

Figure 3:
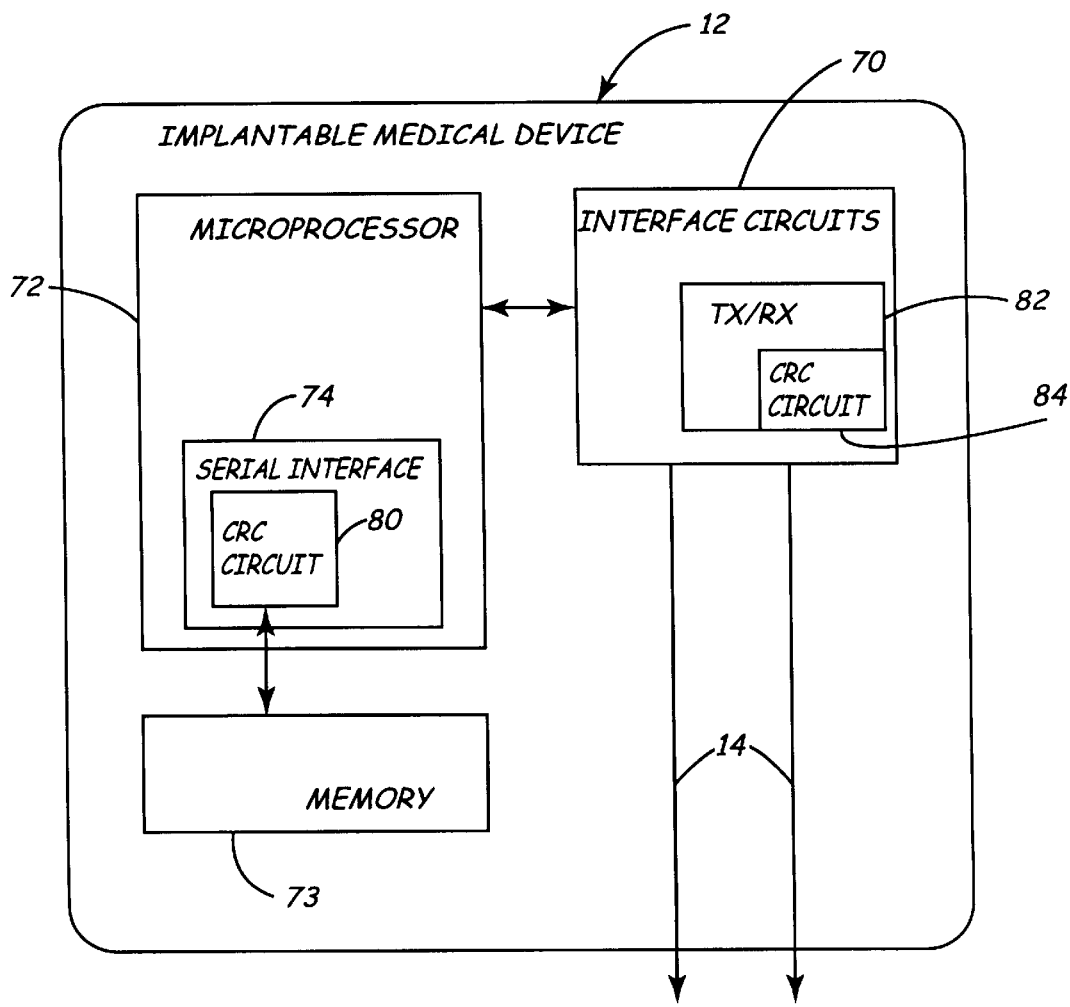
FIG. 3 is a more general block diagram of the implantable medical device of FIG. 1, e.g., such as the device shown in FIG. 2, employing cyclic redundancy calculation circuitry according to the present invention.

FIG. 3 shows a general block diagram of an embodiment of the implantable medical device 12 of FIG. 1 according to the present invention. The generalized diagram of the implantable medical device 12 in FIG. 3 is a general representation of the implantable medical device 11 shown in FIG. 2, but is also representative of various other types of implantable medical devices such as those previously mentioned herein.

Implantable medical device 12 includes a microprocessor 72 and interface circuits 70. Interface circuits 70 may include pacing leads 14 connected thereto such as used in the pacemaker 11 as shown in FIG. 2. Further, microprocessor 72 includes serial interface circuitry 74 for accessing memory 73. For example, memory 73 may be any type of memory accessible by the microprocessor 72 including electrically erasable read only memory (ROM) or any other non-volatile memory. Serial interface circuitry 74 includes cyclic redundancy calculation circuitry 80 according to the present invention. Cyclic redundancy calculation circuitry 80 is built into the serial interface 74 of the microprocessor 72 to provide CRC codes for error detection and/or error correction.

In one illustrative embodiment of the present invention, the cyclic redundancy calculation circuitry 80 is operable, upon selection, to perform polynomial division calculations resulting in a CRC codes, i.e., polynomial remainders, using a selected generator polynomial of multiple, i.e., two or more, available generator polynomials. For example, in one preferred embodiment, a 16-bit CRC code generation mode or an 8-bit CRC code generation mode may be selected to be performed by the CRC calculation circuitry 80. Upon selection, the cyclic redundancy calculation circuitry 80 implements one of a particular pair of generator polynomials designed to have the required error characteristics and which share all low order coefficient values. For example, the first generator polynomial of the pair of generator polynomials which is of a higher order than the second generator polynomial of the pair is used in a polynomial division to generate a CRC code that is 16-bits long and useful for larger block sizes or for special circumstances where additional error detection capability is desirable. For example, a 16-bit CRC code may encode up to 65,519 bits of data. The second generator polynomial of the pair, i.e., a generator polynomial of lower order than the first generator polynomial, when used in a polynomial division, results in a CRC code that is 8-bits long and suitable for small data block sizes. For example, an 8-bit CRC code may be used to encode up to 247 data bits.

By implementing cyclic redundancy calculation circuitry 80 using multiple generator polynomials to provide 8-bit CRC codes and 16-bit CRC codes, memory space use can be reduced. For example, small blocks of data can be used without wasting memory space. In other words, space saved by using an 8-bit CRC code as opposed to a 16-bit CRC code for small blocks of data is achieved. When it is required that high efficiency in block storage be accomplished, then larger block storage using the 16-bit CRC code is possible.

By implementing cyclic redundancy calculation circuitry 80 using multiple generator polynomials to provide 8-bit CRC codes and 16-bit CRC codes, flexibility in storage of data in memory 73 is also achieved. It is important in implantable medical devices that must meet low power requirements that such flexibility be available. For example, writing back data to memory 73 by microprocessor 72 requires a significant amount of power. The power consumption used to write larger blocks of data to memory 73 is significantly greater than that used to write smaller blocks of data to memory 73. As such, it is generally preferred to use smaller blocks of data when possible to conserve power. However, in some circumstances, for example when time efficiency is required, using larger blocks of data may be beneficial. Therefore, it is desirable to provide the flexibility of using multiple CRC codes to implement different design functionality.

Generally, use of the cyclic redundancy calculation circuitry 80 in the microprocessor serial interface 74 includes encoding data being written to memory 73 and/or decoding data read from memory 73 under control of processor 72. In other words, under control of processor 72, serial interface 74 is used to encode and write received data to memory 73. For example, cyclic redundancy calculation circuitry 80 operates on blocks of data received thereby to generate CRC codes to be stored with the blocks of data in memory 73.

In a similar manner, for example, under control of processor 72, memory 73 is addressed and serial interface 74 is used to read data stored in memory 73, e.g., data stored in memory which has been encoded using CRC calculation circuitry. Cyclic redundancy calculation circuitry 80 then decodes the data by performing a polynomial division thereon to determine whether an error has been detected based on the CRC code, i.e., remainder, of the polynomial division. For example, if the remainder is a zero polynomial, then no error is detected. However, if the remainder is not a zero polynomial, then an error is detected.

One skilled in the art will recognize that the cyclic redundancy calculation circuitry described herein is useable in various other applications related to implantable medical devices in addition to the communication of data to and from memory as described above. For example, as shown in FIG. 3, a cyclic redundancy calculation circuit 84 may be used in combination with receiver/transmitter circuitry 82 for communication with an external programming device (not shown), such as described in U.S. Pat. No. 5,354,319 to Wyborny et al. In such a device, the receiver/transceiver circuitry 82 would include cyclic redundancy calculation circuitry 84 for encoding and decoding information communicated between the implantable medical device and the external programmer (not shown) and, also, the external programmer (not shown) would include cyclic redundancy calculation circuitry for encoding and decoding communicated data.

Cyclic redundancy calculation circuitry as described herein may also be used for soft error correction in communication of information with random access memories (RAMs), in addition to nonvolatile memories. As such, one skilled in the art will recognize that polynomial division using cyclic redundancy calculation circuitry as described herein and/or the design of generator polynomials as described herein may be used for the communication of data for various applications in implantable medical devices. However, the present invention is not limited to use in implantable medical devices but is applicable to the communication of data whenever CRC codes are generated and/or error detection or correction is being performed.

Further, one skilled in the art will recognize that the 8-bit/6-bit CRC code illustration given above is for illustration only and that various other bit lengths for the CRC code may be implemented according to the present invention. For example, CRC codes generated according to the present invention may be of any size useful in a particular system. For example, 12-bit, 24-bit, or 4-bit CRC codes may be used according to the present invention. However, according to the present invention, the generator polynomials designed for use in polynomial divisions to calculate such CRC codes must be generator polynomials that share lower order terms.

For example, a generator polynomial used to calculate a 24-bit CRC code may share lower terms of a generator polynomial used to calculate an 8-bit CRC code.

Further, although the description herein is described with simplicity with respect to the use of two generator polynomials selectable to generate the desired CRC code, it is possible to implement more than two generator polynomials such that more flexibility is provided in the system. For example, three generator polynomials may be implemented for selected operation on a data stream with resultant 24-bit, 16-bit, and 8-bit CRC codes resulting therefrom upon polynomial division by a respective selected generator polynomial. In such a case, it would be required that the generator polynomial used to calculate the 24-bit CRC code share lower order terms of the generator polynomial used to calculate the 16-bit CRC code and, further, that the generator polynomial used to calculate the 16-bit CRC codes share lower order terms of the generator polynomial used to calculate the 8-bit CRC codes. As such, one skilled in the art will recognize that any multiple number of generator polynomials may be implemented according to the present invention and that the resultant CRC codes may be of varied bit lengths for coding various data block sizes.

Figure 4:
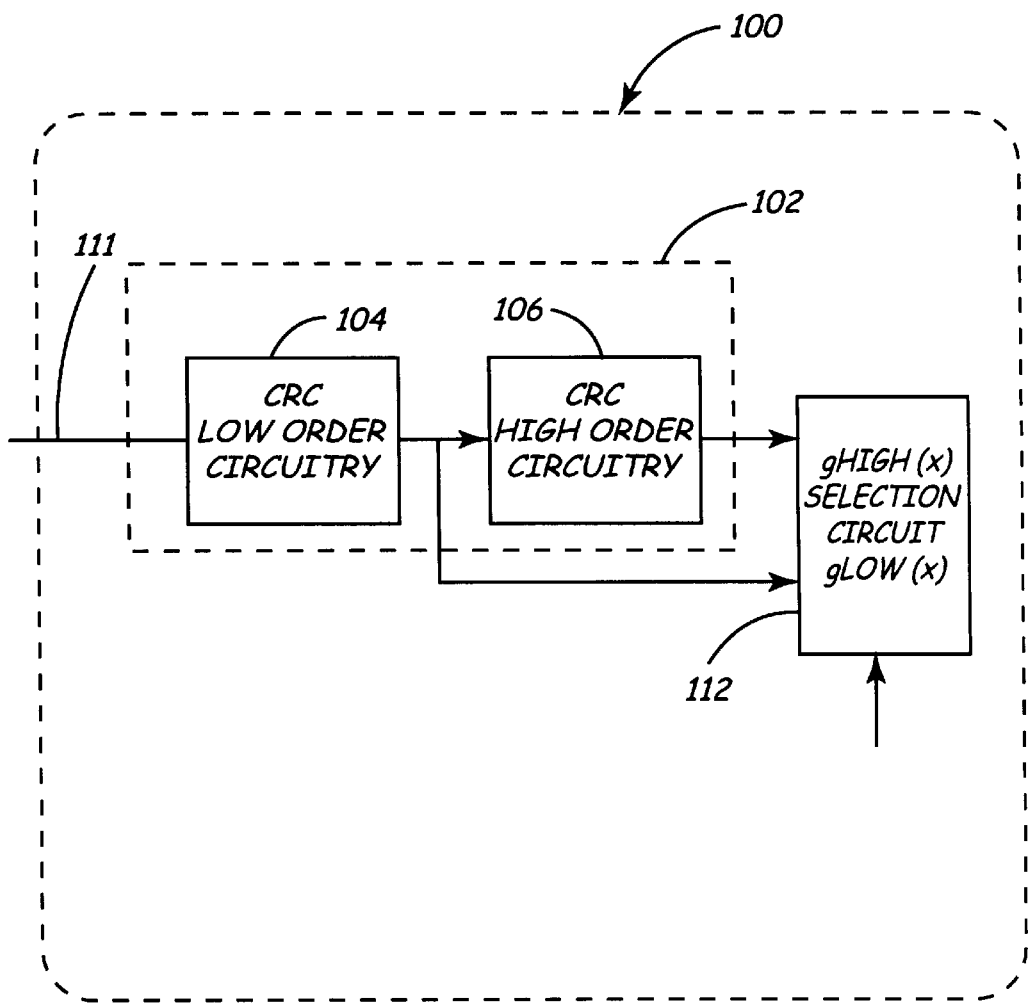
FIG. 4 is a general block diagram of cyclic redundancy calculation circuitry according to the present invention such as that employed in the implantable medical devices illustrated in FIGS. 1–3.

FIG. 4 shows a general block diagram of cyclic redundancy calculation circuitry 100 which may be used, for example, as cyclic redundancy calculation circuitry 80 in serial interface 74, cyclic redundancy calculation circuitry 84 in receiver/transmitter circuitry 82 of implantable medical device 12, or may be used for any other application including those not related to implantable medical devices. Cyclic redundancy calculation circuitry 100 generally includes CRC low order term circuitry 104 and CRC high order term circuitry 106 operatively connected to selection circuitry 112.

Generally, selection circuitry 112 allows for the selection of whether a data stream 111 received by CRC low order term circuitry 104 is to be operated on to divide by a first low order generator polynomial ($g_{low}(x)$) having a set of low order terms or is to be operated on to divide by a second higher order generator polynomial ($g_{high}(x)$). As shown in FIG. 4, if selection circuitry 112 is selected to divide by the lower order generator polynomial ($g_{low}w(x)$), then data stream 111 is operated on by CRC low order term circuitry 104 which performs a polynomial division operation resulting in a CRC code, e.g., 8-bit CRC code. On the other hand, if selection circuitry 112 is selected to divide by the higher order generator polynomial ($g_{high}(x)$), then polynomial division circuitry 102, which includes both CRC low order term circuitry 104 and CRC high order term circuitry 106, is used to perform a polynomial division operation resulting in a relatively larger length CRC code when compared to the CRC code generated by CRC low order term circuitry 104 when dividing by lower order generator polynomial ($g_{low}(x)$).

As illustrated in FIG. 4, in addition to meeting criteria for error performance, the higher order generator polynomial ($g_{high}(x)$) is constrained to be expressed as a sum of higher order terms and the lower order generator polynomial ($g_{low}(x)$). By constraining the generators to share lower order terms, circuit implementation is reduced, e.g., circuitry can be shared to perform a selected polynomial division using one of a plurality of generator polynomials.

Generally, to calculate a CRC code using the cyclic redundancy calculation circuitry 100 shown generally in FIG. 4, the data stream 111, e.g., one or more data blocks or messages to be encoded or decoded using the CRC calculation circuitry 100, is considered as a long polynomial with binary coefficients. The data polynomial, i.e., the polynomial representative of data blocks to be encoded or decoded, is divided by the selected generator polynomial, e.g., $g_{low}(x)$ or $g_{high}(x)$, which have been designed within at least the above-described constraint, e.g., the higher order generator polynomial ($g_{high}(x)$) sharing all the terms of the lower order generator polynomial ($g_{low}(x)$).

As one illustrative design of the generator polynomials, the higher order generator polynomial ($g_{high}(x)$) may be expressed as $g_{16}(x)=x^{16}+x^{12}+x^{11}+x^9+g_8(x)$, with the lower order generator polynomial ($g_{low}(x)$) expressed as $g_8(x)=x^8+x^5+x^4+1$. As such, $g_{16}(x)$ shares the identical terms of $g_8(x)$. Selection circuitry 112 can then be used to select a polynomial division by the generator polynomial $g_6(x)$ to calculate a 16-bit CRC code or to select a polynomial division by the generator polynomial $g^8(x)$ to calculate an 8-bit CRC code.

As previously indicated, a 16-bit CRC code may be used for encoding and decoding up to 65,519 bits, whereas an 8-bit CRC code may be used to encode and decode up to 247 data bits. Thus, with minimal addition of circuitry, flexibility of being able to divide by multiple generator polynomials using shared resources is achieved according to the present invention. In other words, the. CRC low order term circuitry 104 is used when performing a polynomial division by both the higher order generator polynomial ($g_{high}(x)$) and the lower order generator polynomial ($g_{low}(x)$).

Preferably, the CRC low order term circuitry 104 and CRC high order term circuitry 106 are implemented using linear feedback shift register circuitry, although other circuit implementations are possible if the constraints on the generator polynomials as described herein are met. Further, preferably, such linear feedback shift register circuitry is implemented using serially connected latches, e.g., d-flipflops, and exclusive or (XOR) gates. Generally, the generator polynomial is built into the circuit design by the serially connecting XOR gates between certain latches as shall be described further below.

With reference to FIGS. 5 and 6, polynomial division operations implemented using linear feedback shift register circuitry shall be illustratively described. For simplicity, the pair of generator polynomials described above, i.e., $g_{16}(x)$ and $g_8(x)$, are described in the below illustrative embodiment of the present invention. In other words, the higher order generator polynomial ($g_{16}(x)$) is expressed as a set of terms including higher order terms and all the terms of the lower order generator polynomial ($g_8(x)$).

Figure 5A:
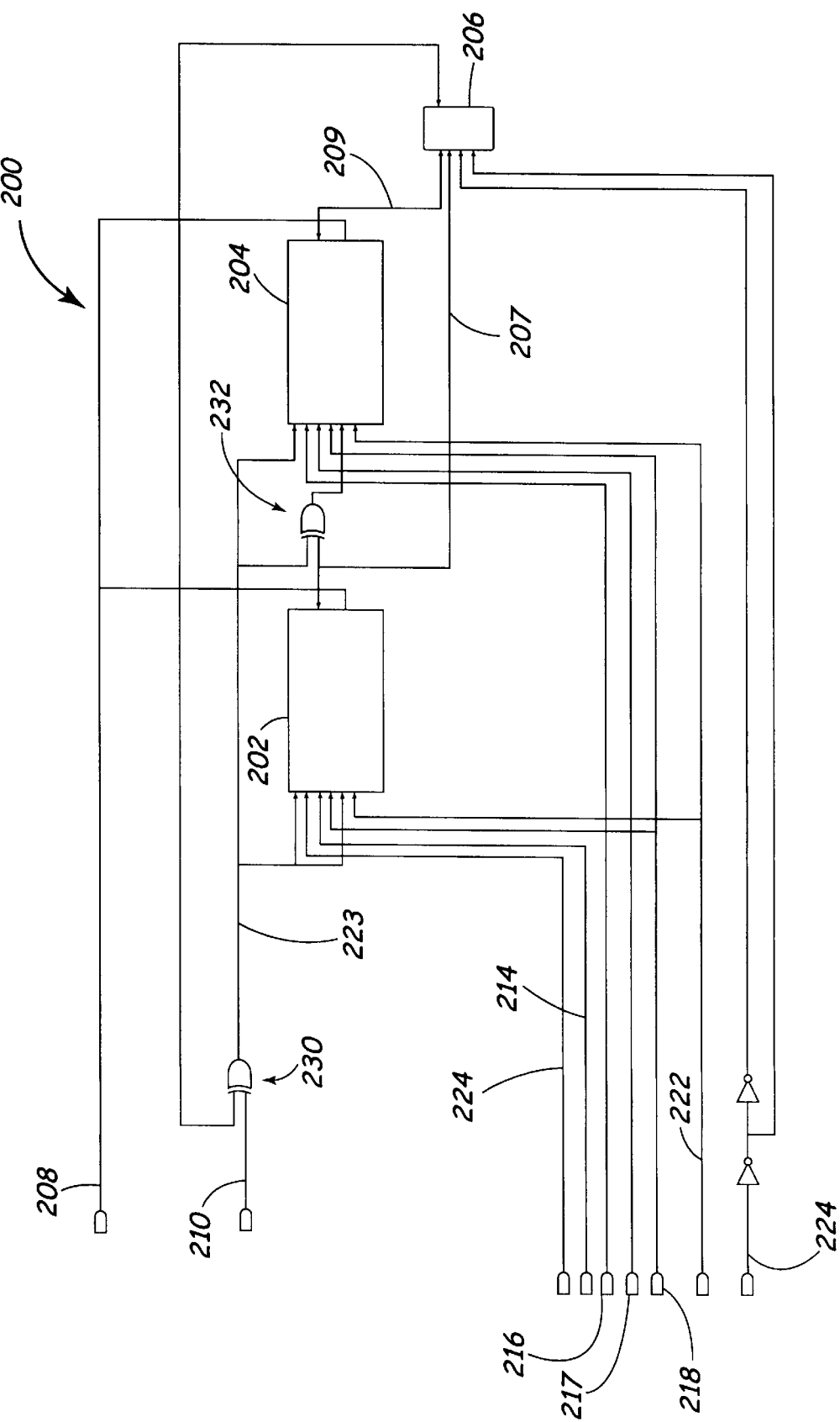
FIG. 5A is one embodiment of the cyclic redundancy calculation circuitry shown generally in FIG. 4 according to the present invention.
Figure 5B:
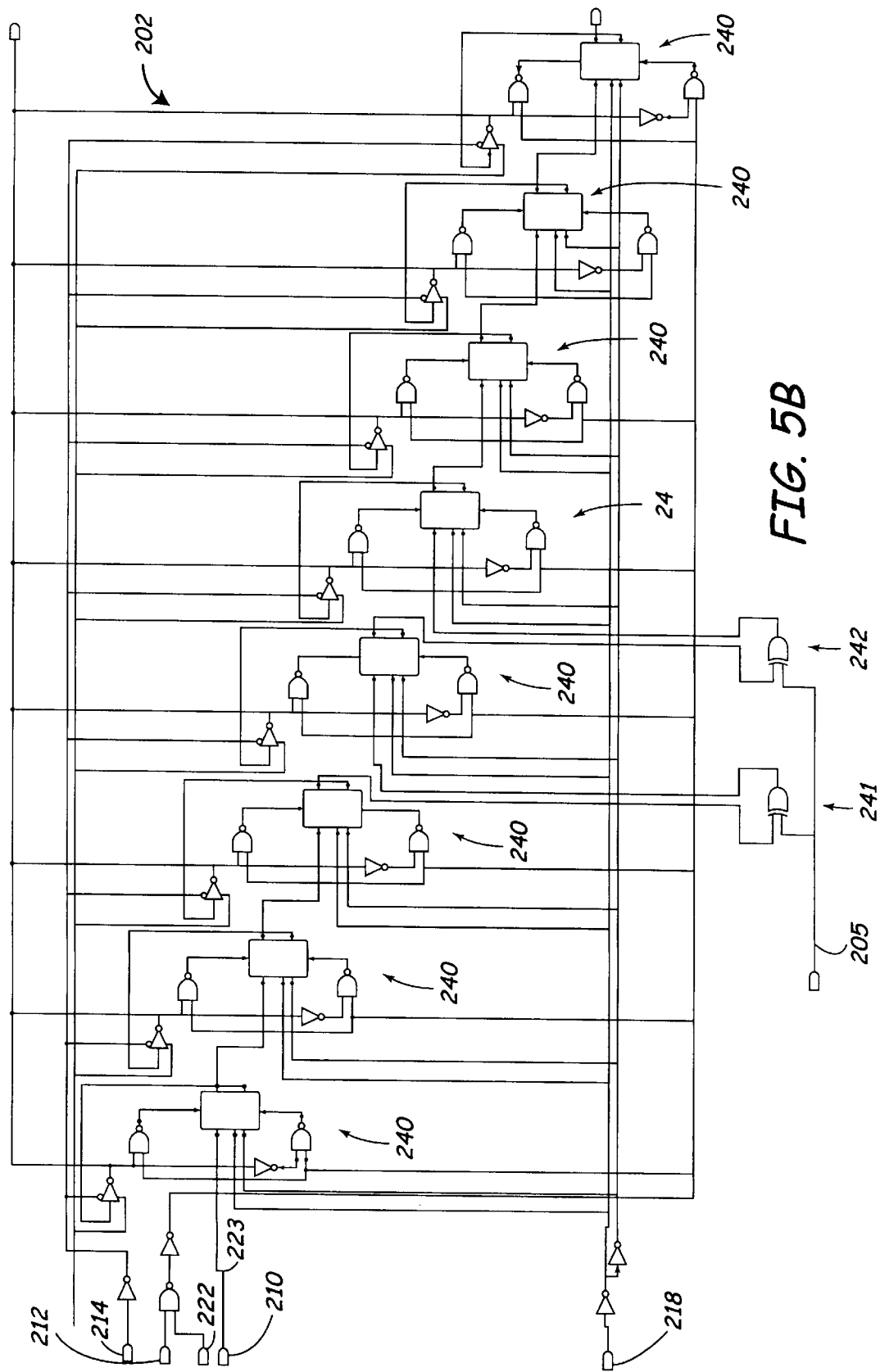
FIG. 5B and FIG. 5C are schematic diagrams of linear feedback shift registers of the cyclic redundancy calculation circuitry shown in FIG. 5A.
Figure 5C:
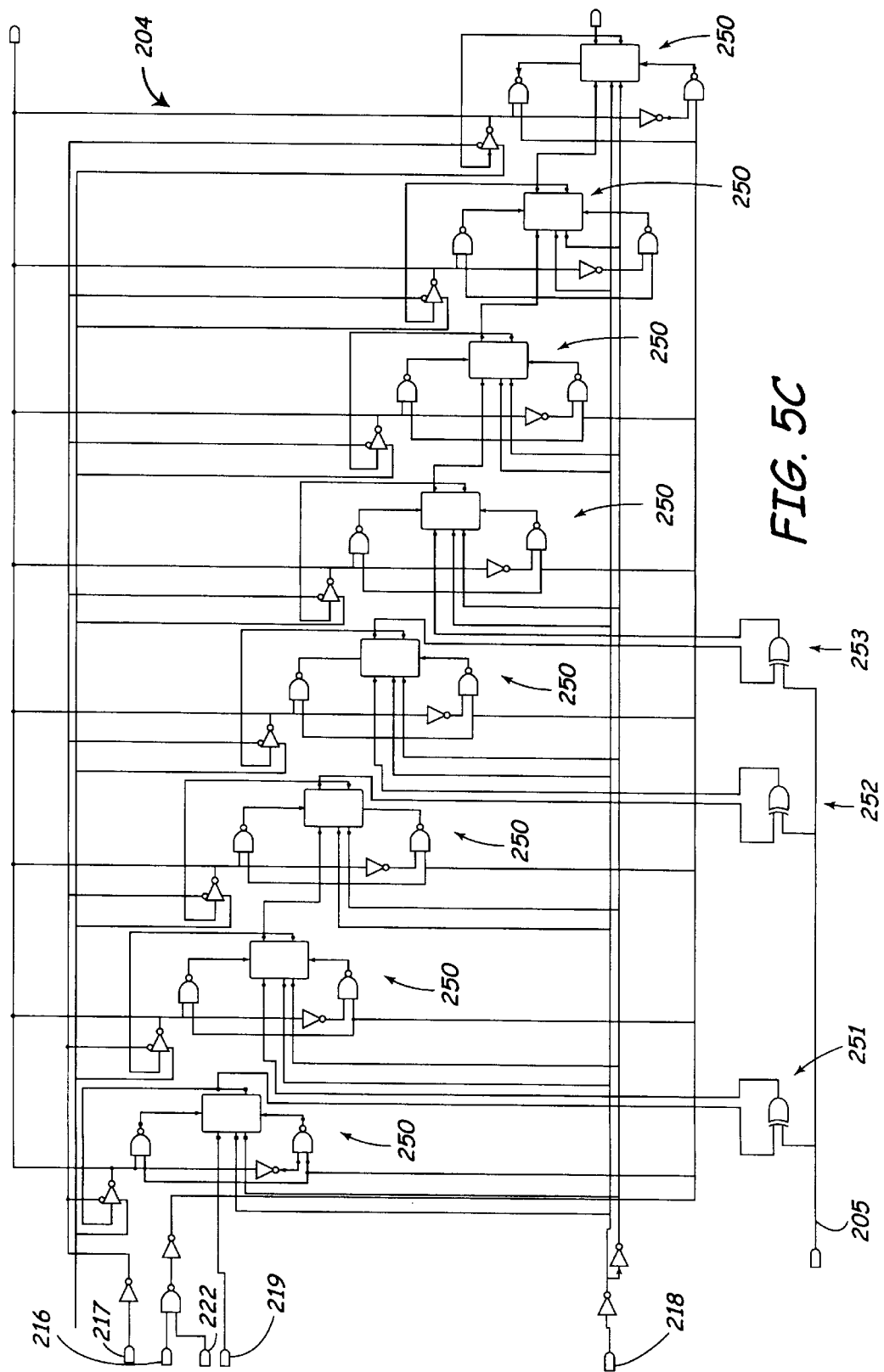

One illustrative embodiment of the CRC calculation circuitry 100 is shown by CRC generator circuitry 200 illustrated in FIGS. 5A–5C for implementing polynomial division for the pair of generator polynomials ($g_{16}(x)$ and $g_8(x)$). A calculation flowchart for the polynomial division is provided in FIG. 5D. An alternate embodiment of the CRC calculation circuitry 100 is shown by the CRC generator circuitry 300 described with reference to FIGS. 6A and 6B for implementing polynomial division for the pair of generator polynomials ($g_{16}(x)$ and $g_8(x)$). Generally, the linear feedback shift register circuitry of both implementations described with reference to FIGS. 5A–5D and FIGS. 6A–6B are substantially similar except with respect to the manner in which the CRC codes are output, e.g., parallel output (FIGS. 5A–5D) versus serial output (FIGS. 6A–6B). CRC generator circuitry 200, as shown in FIG. 5A, includes first linear feedback shift register circuitry 202, second linear feedback shift register circuitry 204, and 8-bit/16-bit CRC code selection multiplexer 206. First linear feedback shift register circuitry 202 is serially connected through XOR gate 232 to second linear feedback shift register circuitry 204 with feedback 205 provided from multiplexer 206 to one input of XOR gate 230. The other input to XOR gate 230 is data input line 210.

As shown in FIG. 5A, 8-bit/16-bit CRC code select line 224 is used to select the generator polynomial ($g_{16}(x)$ or $g_8(x)$) to be used for the polynomial division performed by the CRC generator circuitry 200. The select line 224 provides complementary signals as known to those skilled in the art to multiplexer 206. Upon selection of the 8-bit CRC code generation mode (i.e., division by $g_8(x)$), data input on data line 210, e.g., blocks of data, is operated upon by first linear feedback shift register circuitry 202 with the output thereof provided to multiplexer 206 via line 207. As such, a polynomial division using the generator polynomial $g_8(x)$ is performed using the first linear feedback shift register circuitry 202.

Likewise, in a similar manner, upon selection of the 16-bit CRC code generation mode (i.e., division by $g_{16}(x)$) via multiplexer 206, data input on data line 210, e.g., blocks of data, is operated upon by both the first linear feedback shift register circuitry 202 and the second linear feedback shift register circuitry 204 for providing a 16-bit CRC code upon completion of the polynomial division by the higher order generator polynomial $g_6(x)$. With the 16-bit CRC code generation mode selected per multiplexer 206, the output of the second linear feedback shift register circuitry 204 is provided to 2:1 multiplexer 206 via line 209.

Various other control signals and outputs are provided as shown in FIG. 5A. For example, serial clock line 218 is operatively connected for providing a clocking signal to CRC generator circuitry 200. Power on reset line 222 is provided for resetting the CRC generator circuitry 200. Write control line 212 and read control line 214 are connected to first linear feedback shift register 202 for controlling the reading and writing of lower order bits from/to the first linear feedback shift register 202, and write control line 216 and read control lines 217 provide inputs for controlling the reading and writing of bits from/to second linear feedback shift register circuitry 204. Data is output from first linear feedback shift register circuitry 202 and second linear feedback shift register circuitry 204 on data input/output line 208 in a parallel manner, e.g., 8-bits at a time as illustrated in FIG. 5A.

FIG. 5B is a more detailed schematic diagram of first linear feedback shift register circuitry 202. First linear feedback shift register circuitry 202 is implemented using a plurality of latches 240, e.g., d-flip-flops, serially connected with XOR gates 241–242. Serial clock input 218, as shown in FIG. 5B, provides the clock to shift data applied on input line 223 through the first linear feedback shift register circuitry 202. Power on reset line 202 is connected for clearing the latches 240 and write/read lines 212, 214 are connected for controlling the reading and/or writing of data to and from the latches 240.

FIG. 5C is a more detailed schematic diagram of the second linear feedback shift register circuitry 204 and includes latches 250, e.g., d-flip-flops, serially connected with XOR gates 551–553. Serial clock 218 is also provided to latches 250 for shifting data provided thereto at input line 219 serially through the linear feedback shift register circuitry 204. Power on reset line 222 is used for the clearing the latches 250 and read/write control lines 217, 216, respectively, are used for controlling reading and writing of data from/to latches 250.

In both FIGS. 5B and 5C, each of the XOR gates configured with the latches 240, 250 are provided with a feedback line 205 as one input thereto. It will be recognized that linear feedback shift register circuitry 202, 204 is configured using latches and XOR gates for providing division by the generator polynomials $g_8(x)$ and $g_{16}(x)$. In other words, the XOR gates are positioned between certain latches to provide division by desired generator polynomials. The configuration of latches and XOR gates in FIGS. 5A–5C provide for division by generator polynomials $g_8(x)$ and $g_{16}(x)$. However, similar configurations using latches and XOR gates with the XOR gates positioned at different locations within the serial connection of latches provide for implementation of polynomial divisional by other generator polynomials. As such, the configuration illustrated in FIGS. 5A–5C is for illustration only of one embodiment of many embodiments of CRC generator circuitry which can be configured to implement division by a selected generator polynomial of multiple generator polynomials.

As shown in FIGS. 5A–5C, the implementation of the polynomial division for the generator polynomials $g_8(x)$ and $g_{16}(x)$ includes the use of sixteen d-flip-flops, seven XOR gates, and a single 2:1 multiplexer. Implementation of circuits separately to accomplish similar CRC code generation would require additional and duplicate types of circuitry which is unnecessary when using the techniques described herein in accordance with the present invention, e.g., sharing of circuitry to divide by a selected generator polynomial from multiple available generator polynomials.

Figure 5D:
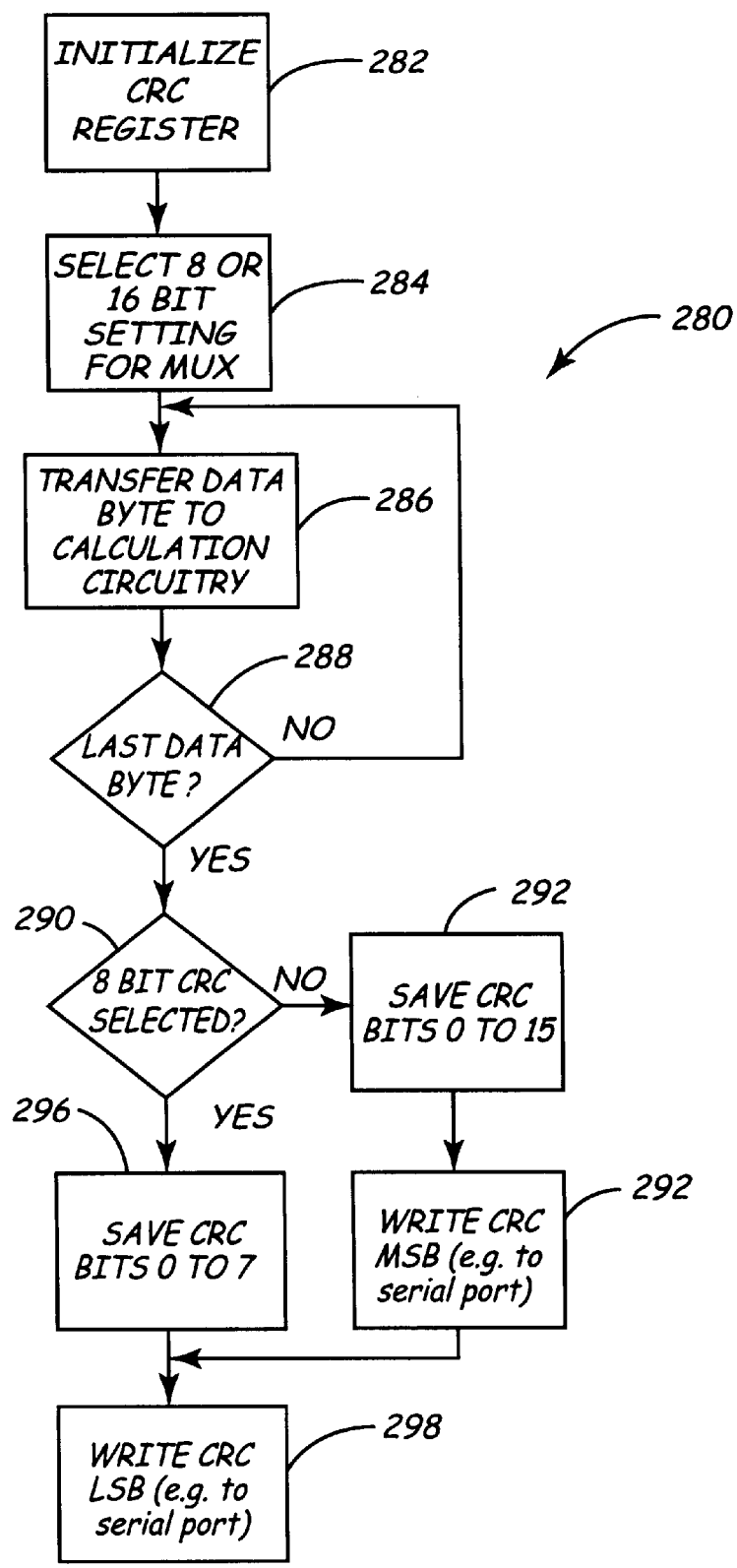
FIG. 5D is a cyclic redundancy calculation flowchart describing the operation of the cyclic redundancy calculation circuitry shown in FIGS. 5A–5C.
Figure 6B:
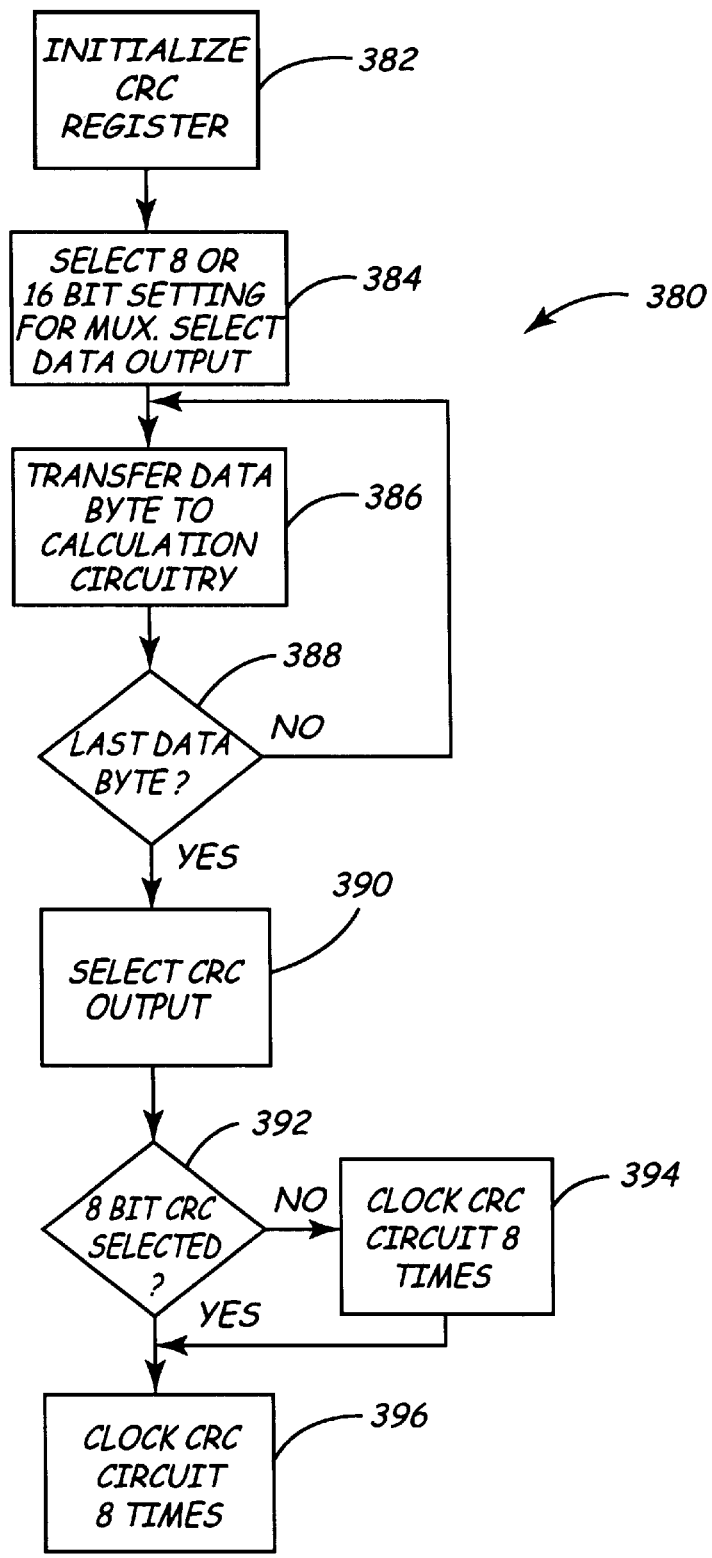
FIG. 6B is a cyclic redundancy calculation flowchart showing operation of the cyclic redundancy calculation circuitry of FIG. 6A.

Operation of the CRC generator circuitry 200 shall now be described with reference to 8-bit/16-bit calculation flowchart 280 as shown in FIG. 5D. First, the encoding of a block of data shall be described. Thereafter, the decoding of a block of data previously encoded shall be described. The CRC generator circuitry 200 is cleared such as by momentarily dropping the power on reset line 222. The CRC code register is initialized with either a zero or a non-zero (block 282) by writing to the data latches 240 via input/output line 208. For simplicity of the description herein, the register is initialized with a zero. Thereafter, as shown in block 284, an 8-bit CRC code or 16-bit CRC code generation mode is selected via line 224 with a suitable signal applied to multiplexer 206. Thereafter, a data block is applied to data input line 210.

Data bytes are continually transferred to the CRC generation circuitry 200 and clocked therethrough (block 286) via a system clock signal applied via serial clock line 218 until the last data byte has been clocked into first linear feedback shift register circuitry 202, i.e., the latches 240 thereof. After the last data byte of the data block to be encoded has been clocked into CRC generator circuitry 200 (block 288), if the 8-bit CRC code generation mode has been selected (block 290), then the lower order bits (CRC bits 0 to 7) in latches 240 are saved (block 296) and the CRC code which is an 8-bit byte, e.g., least significant byte (LSB), is provided as the output thereof. For example, the latches 240 are read under control of read control line 214 and provided in parallel via input/output 208.

If, however, the 16-bit CRC generation mode is selected (block 290), then the lower order and higher order bits 0–15 of latches 240 and latches 250 are saved (block 292) and provided as the 16-bit CRC code. For example, as shown in block 294 of FIG. 5D, the most significant 8-bit byte (MSB, i.e., bits 8–15) is provided, and also, as shown in block 298 of FIG. 5D, the least significant 8-bit byte (LSB, i.e., bits 0–7) is provided. With the generation circuitry 200 of FIGS. 5A–5C, the CRC code is provided in a parallel manner from the CRC generator circuitry 200 at input/output 208. For example, an 8-bit LSB is provided from latches 240 when an 8-bit CRC code is generated and the 8-bit LSB is provided from latches 240 and the 8-bit MSB is provided from latches 250 when a 16-bit CRC code is generated.

Depending upon the application of the calculation circuitry and the CRC codes generated thereby, the CRC code is provided in association with the block of data encoded. For example, with respect to the calculation circuitry 80 as shown in FIG. 3, the CRC code generated for a block of data is written to the serial interface 74 for communication to memory 73. This is also reflected in FIG. 5D in blocks 294 and 298. Further, for example, if the application was for error detection in uplink and/or downlink communication, then the CRC code may be appended to the data block in a transmitted data frame for transmission in an uplink or downlink channel.

To perform decoding operation to determine whether an error is indicated upon receipt of encoded data, a similar operation to that described with reference to FIG. 5D is performed. For example, the CRC generator circuitry 200 is initialized, the 8-bit or 16-bit mode is selected, and the data is clocked through the generator circuitry 200. However, both the data and the appended CRC code associated therewith is clocked through the CRC generator circuitry 200 to perform the selected decoding, e.g., 8-bit CRC decode operation or 16-bit CRC decode operation, by performing a polynomial division using the applicable generator polynomial. If the polynomial division implemented by the CRC generator circuitry 200 results in a non-zero remainder, an error is indicated. If after the polynomial division implemented by the CRC generator circuitry 200 results in a zero remainder, no error is detected. The resulting CRC code, e.g., non-zero or zero, resulting from the decoding operation is output at input/output line 208 and used as desired for the particular application, e.g., error detection and/or correction. This is in contrast to association of the CRC code with the data being operated upon as would be the case when encoding the data block.

FIGS. 6A and 6B show a block diagram of CRC generator circuitry 300 and calculation flowchart 380, respectively, for providing a serial output version of the cyclic redundancy calculation circuitry 100 shown generally in FIG. 4. CRC generator circuitry 300 is generally the same as that shown with respect to CRC generator circuitry 200 except for the addition of an output select multiplexer 330. As such, CRC generator circuitry 300 includes first linear feedback shift register circuitry 302 and second linear feedback shift register circuitry 304 serially connected with XOR gate 332 therebetween and feedback 305 provided as an input to XOR gate 330. The other input to XOR gate 330 is the data input line 310. Further, data input/output line 308 (e.g., used for initializing the decode operation and reading the decode result); low order write/read control lines 312, 314; high order write/read control lines 316, 317; power on reset line 322, system clock line 318, and 8-bit/16-bit CRC code generation mode select line 324, are generally equivalent to those shown with respect to the CRC generator circuitry 200 described herein with reference to FIGS. 5A–5D. Therefore, further detail with respect to such elements shall not be described further with respect to FIGS. 6A–6B.

The CRC generator circuitry 300 further includes the 8-bit/6-bit select multiplexer 306 in a like manner to multiplexer 206 described with reference to FIGS. 5A–5D. However, in the serial output version, for serial output of the CRC codes, output select multiplexer 330 is provided. A data/CRC code select line 331 provides control of the output select 2:1 multiplexer 330 for outputting the desired output data therefrom as described further below, e.g., data or CRC code bits.

The operation of the circuitry shall be described using the 8-bit/16-bit CRC code calculation flowchart 380 of FIG. 6B. First, encoding of data shall be described. Thereafter, decoding of encoded data shall be described. In a like manner as described with reference to FIG. 5D, the generator circuitry 300 is initialized by momentarily dropping the power on reset 322. The CRC register is initialized with either a zero or a non-zero (block 382) and thereafter an 8-bit CRC code generation mode or a 16-bit CRC code generation mode of operation is selected (block 384). As shown in block 384, along with the selection of the 8-bit or 16-bit CRC code generation mode for multiplexer 306, data/CRC select line 331 is set (block 384) such that data is output from the multiplexer 331. As such, data is clocked into the data input 310. For example, in 8-bit mode, up to 247 data bits can be entered, and in 16-bit mode, up to 65,519 data bits can be entered. After the data has been clocked into the CRC generator circuitry 300 as illustrated in blocks 386 and 388, upon shifting of the last data byte therein, the data/CRC output select line 331 is set such that CRC code is output therefrom (block 390).

Thereafter, the generator circuitry 300 is clocked 8 or 16 more times depending upon the setting of the 8-bit/16-bit CRC code generation mode being performed. For example, as shown in FIG. 6B, the CRC generator circuitry 300 is clocked 8 times to output 8 bits of the CRC code (block 396) from latches of the first linear feedback shift register circuitry 302. If the 16-bit CRC code generation mode is selected (block 392), then the CRC generator circuitry 300 is clocked an additional 8 times (block 394) to output the remaining 8 bits of the CRC code from the latches of the second linear feedback shift register circuitry 304. The CRC code output is then used according to the specific design application, e.g., appended to or stored with the data block encoded for storage in memory 73 as shown in FIG. 3.

Likewise, to use serial output CRC generator circuitry 300 for decoding, an operation flow similar to that shown for encoding in FIG. 6B is performed. The generator circuitry 300 is cleared and the 8-bit/16-bit CRC selection mode is set to select either 8-bit CRC code operation or 16-bit CRC code operation. Unlike encoding, the setting of the data/CRC output select line 331 is immaterial. The data provided at the input 310 is clocked through the generator circuitry 300 until all the data is provided therethrough, including the CRC code for the data block, for division by the selected generator polynomial. After the data and the is CRC code have been clocked through the CRC generator circuitry 300, if a non-zero remainder is indicated as read on input/output line 308, then an error in the data has occurred. If, however, a zero remainder results from the polynomial division by the applicable polynomial generator, then error free operation is indicated.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize cyclic redundancy checking according to the present invention. Various modifications of the illustrative embodiments, as well as additional embodiments of the invention, will be apparent to persons skilled in the art upon reference to this description.

What is claimed is:

1. A method for providing a cyclic redundancy calculation in a medical device, the method comprising the steps of:
providing a medical device having a housing;
providing one or more circuits to implement at least a first and second cyclic redundancy code generator polynomial, wherein the first cyclic redundancy code generator polynomial is a polynomial expressed as a first set of terms and is of a higher order than the second cyclic redundancy code generator polynomial which is expressed as a second set of terms, and further wherein the first set of terms of the first cyclic redundancy code generator polynomial contains all the second set of terms of the second cyclic redundancy code generator polynomial; and
enclosing the one or more circuits within the housing of the medical device.

2. The method of claim 1, wherein the method further includes selecting between use of the first and second cyclic redundancy code generator polynomial to perform a polynomial division for a data stream input to the one or more circuits resulting in a cyclic redundancy code.

3. The method of claim 2, wherein providing one or more circuits to implement at least a first and second cyclic redundancy code generator polynomial includes providing a first linear feedback shift register circuit and a second linear feedback shift register circuit, and further wherein selecting between use of the first and second cyclic redundancy code generator polynomial to perform a polynomial division includes using both the first linear feedback shift register circuit and the second linear feedback shift register circuit to perform a polynomial division using the first cyclic redundancy code generator polynomial and using one of the first and second linear feedback shift register circuits to perform a polynomial division using the second cyclic redundancy code generator polynomial.

4. The method of claim 3, wherein the first and second linear feedback shift register circuits are implemented using serially connected latches and XOR gates.

5. The method of claim 3, wherein selection of the first cyclic redundancy code generator polynomial results in a 16-bit cyclic redundancy code and selection of the second cyclic redundancy code generator polynomial results in an 8-bit cyclic redundancy code.

6. The method of claim 2, wherein the data stream includes data received from a memory device of the medical device.

7. The method of claim 6, wherein the data stream includes data received from a non-volatile memory device of the medical device.

8. The method of claim 2, wherein the data stream includes data communicated between a transmitter and a receiver.

9. The method of claim 1, wherein the medical device includes an implantable device selected from one of a pacemaker, a defibrillator, a pacemaker/cardioverter/defibrillator, a cardioverter/defibrillator, a brain stimulator, a neurostimulator, a muscle stimulator, a gastric stimulator, an implantable monitor, a hemodynamic monitor, and a drug pump.

10. A method for use in performing a cyclic redundancy calculation in a medical device, the method comprising the steps of:
receiving a data stream representative of information associated with the medical device; and
operating on the data stream to perform a polynomial division using one of at least a first cyclic redundancy code generator polynomial and a second cyclic redundancy code generator polynomial to generate a cyclic redundancy code, wherein the first cyclic redundancy code generator polynomial is a higher order polynomial than the second cyclic redundancy code generator polynomial and contains all terms of the second cyclic redundancy code generator polynomial.

11. The method of claim 10, wherein operating on the data stream to perform a polynomial division includes:
providing a first linear feedback shift register circuit and a second linear feedback shift register circuit; and
selecting between use of the first and second cyclic redundancy code generator polynomial to perform a polynomial division, wherein both the first linear feedback shift register circuit and the second linear feedback shift register circuit are used to perform a polynomial division when use of the first cyclic redundancy code generator polynomial is selected, and further wherein one of the first and second linear feedback shift register circuits is used to perform a polynomial division when use of is the second cyclic redundancy code generator polynomial is selected.

12. The method of claim 11, wherein the first and second linear feedback shift register circuits are implemented using serially connected latches and XOR gates.

13. The method of claim 10, wherein the polynomial division is used to encode the data stream.

14. The method of claim 10, wherein the data stream includes data received from a memory device of the medical device.

15. The method of claim 10, wherein the polynomial division is used to decode the data stream.

16. The method of claim 10, wherein the medical device is an implantable device selected from one of a pacemaker, a defibrillator, a pacemaker/cardioverter/defibrillator, a cardioverter/defibrillator, a brain stimulator, a neurostimulator, a muscle stimulator, a gastric stimulator, an implantable monitor, a hemodynamic monitor, and a drug pump.

17. A medical device comprising:
a housing;
one or more circuits enclosed in the housing, wherein the one or more circuits are operable to receive a data stream representative of information associated with the medical device, and further wherein the one or more circuits are operable on the data stream to perform a polynomial division using one of at least a first cyclic redundancy code generator polynomial and a second cyclic redundancy code generator polynomial to generate a cyclic redundancy code, wherein the first cyclic redundancy code generator polynomial is a higher order polynomial than the second cyclic redundancy code generator polynomial and contains all terms of the second cyclic redundancy code generator polynomial.

18. The device of claim 17, wherein the one or more circuits include:
a first linear feedback shift register circuit and a second linear feedback shift register circuit configured to perform the polynomial division; and
a multiplexer for use in selecting between use of the first and second cyclic redundancy code generator polynomial to perform the polynomial division.

19. The device of claim 18, wherein both the first linear feedback shift register circuit and the second linear feedback shift register circuit are used to perform a polynomial division using the first cyclic redundancy code generator polynomial and wherein one of the first and second linear feedback shift register circuits is used to perform a polynomial division using the second cyclic redundancy code generator polynomial.

20. The device of claim 19, wherein the first and second linear feedback shift register circuits are implemented using serially connected latches and XOR gates.

21. The device of claim 19, wherein the polynomial division using the first cyclic redundancy code generator polynomial results in a 16-bit cyclic redundancy code and the polynomial division using the second cyclic redundancy code generator polynomial results in an 8-bit cyclic redundancy code.

22. The device of claim 17 wherein the polynomial division is used for encoding the data stream.

23. The device of claim 17, wherein the data stream includes data received from a memory device of the medical device.

24. The device of claim 17, wherein the polynomial division is used for decoding the data stream.

25. The method of claim 17, wherein the medical device is an implantable device selected from one of a pacemaker, a defibrillator, a pacemaker/cardioverter/defibrillator, a cardioverter/defibrillator, a brain stimulator, a neurostimulator, a muscle stimulator, a gastric stimulator, an implantable monitor, a hemodynamic monitor, and a drug pump.

26. A method for use in performing a cyclic redundancy calculations, the method comprising:
providing a data stream; and
operating on the data stream to perform a polynomial division thereon using one of at least a first cyclic redundancy code generator polynomial and a second cyclic redundancy code generator polynomial to generate a cyclic redundancy code, wherein the first cyclic redundancy code generator polynomial is a higher order polynomial than the second cyclic redundancy code generator polynomial and contains all terms of the second cyclic redundancy code generator polynomial.

27. The method of claim 26, wherein operating on the data stream to perform a polynomial division includes:
providing a first linear feedback shift register circuit and a second linear feedback shift register circuit; and
selecting between use of the first and second cyclic redundancy code generator polynomial to perform the polynomial division, wherein both the first linear feedback shift register circuit and the second linear feedback shift register circuit are used to perform a polynomial division when use of the first cyclic redundancy code generator polynomial is selected, and further wherein one of the first and second linear feedback shift register circuits is used to perform a polynomial division when use of the second cyclic redundancy code generator polynomial is selected.

28. The method of claim 27, wherein the first and second linear feedback shift register circuits are each implemented using serially connected latches and XOR gates.

29. The method of claim 28, wherein operating on the data stream to perform a polynomial division thereon using the first cyclic redundancy code generator polynomial includes:
clocking a block of data of the data stream through the serially connected first and second linear feedback shift register circuits; and
providing the cyclic redundancy code from both the first and second linear feedback shift register circuits after the block of data is clocked into the serially connected first and second linear feedback shift register circuits.

30. The method of claim 28, wherein operating on the data stream to perform a polynomial division thereon using the second cyclic redundancy code generator polynomial includes:
clocking a block of data of the data stream through at least the first linear feedback shift register circuit; and
providing the cyclic redundancy code from the first linear feedback shift register circuit of the serially connected first and second linear feedback shift register circuits after the block of data is clocked into at least the first linear feedback shift register circuit.

31. A method for performing a cyclic redundancy calculation, the method comprising:
providing one or more blocks of data;
operating on a first block of data to perform a polynomial division thereon using a first cyclic redundancy code generator polynomial to generate a cyclic redundancy code for the block of data; and
operating on a second block of data to perform a polynomial is division thereon using a second cyclic redundancy code generator polynomial to generate a cyclic redundancy code, wherein operating on the second block of data to perform the polynomial division thereon using the second generator polynomial is performed using a portion of circuitry used to operate on the first block of data to perform the polynomial division thereon using a first cyclic redundancy code generator polynomial.

32. The method of claim 31, wherein the first cyclic redundancy code generator polynomial is a polynomial expressed as a first set of terms and is of a higher order than the second cyclic redundancy code generator polynomial which is expressed as a second set of terms, and further wherein the first set of terms of the first cyclic redundancy code generator polynomial contains all the second set of terms of the second cyclic redundancy code generator.

33. The method of claim 31, wherein the method further includes selecting between use of the first and second cyclic redundancy code generator polynomial to perform a polynomial division for a data block.

34. The method of claim 31, wherein the circuitry includes a first linear feedback shift register circuit operatively connected to a second linear feedback shift register circuit, and further wherein both the first linear feedback shift register circuit and the second linear feedback shift register circuit are used to perform a polynomial division using the first cyclic redundancy code generator polynomial and wherein one of the first and second linear feedback shift register circuits is used to perform a polynomial division using the second cyclic redundancy code generator polynomial.

35. The method of claim 34, wherein the first and second linear feedback shift register circuits are implemented using serially connected latches and XOR gates.

36. The method of claim 31, wherein polynomial division using the first cyclic redundancy code generator polynomial results in a 16-bit cyclic redundancy code and polynomial division using the second cyclic redundancy code generator polynomial results in an 8-bit cyclic redundancy code.

37. A cyclic redundancy code calculation apparatus comprising one or more circuits to receive one or more data blocks, and further wherein the one or more circuits are operable on the one or more data blocks to perform a polynomial division using one of at least a first cyclic redundancy code generator polynomial and a second cyclic redundancy code generator polynomial to generate a cyclic redundancy code, wherein the first cyclic redundancy code generator polynomial is a higher order polynomial than the second cyclic redundancy code generator polynomial and contains all terms of the second cyclic redundancy code generator.

38. The apparatus of claim 37, wherein the one or more circuits include:
   a first linear feedback shift register circuit operatively connected to a second linear feedback shift register circuit to perform the polynomial division; and
   a multiplexer for use in selecting between use of the first and second cyclic redundancy code generator polynomial to perform the polynomial division.

39. The apparatus of claim 38, wherein both the first linear feedback shift register circuit and the second linear feedback shift register circuit are used to perform a polynomial division using the first cyclic redundancy code generator polynomial and wherein one of the first and second linear feedback shift register circuits is used to perform a polynomial division using the second cyclic redundancy code generator polynomial.

40. The apparatus of claim 39, wherein the first and second linear feedback shift register circuits include serially connected latches and XOR gates.

41. The apparatus of claim 38, wherein selection of the first cyclic redundancy code generator polynomial results in a 16-bit cyclic redundancy code and selection of the second cyclic redundancy code generator polynomial results in an 8-bit cyclic redundancy code.

42. A cyclic redundancy code calculation apparatus comprising:
   a first linear feedback shift register circuit operable to receive data;
   a second linear feedback shift register circuit serially connected to the first linear feedback shift register circuit, wherein the first linear feedback shift register circuit is configured with the second linear feedback shift register circuit for performing a polynomial division on the data using a first cyclic redundancy code generator polynomial, and further wherein the first linear feedback shift register circuit is configured for use in performing a polynomial division on the data using a second cyclic redundancy code generator polynomial.

43. The apparatus of claim 42, wherein the first cyclic redundancy code generator polynomial is a higher order polynomial than the second cyclic redundancy code generator polynomial and contains all terms of the second cyclic redundancy code generator polynomial.

44. The apparatus of claim 42, wherein the apparatus further includes a multiplexer for use in selecting between use of the first and second cyclic redundancy code generator polynomial to perform the polynomial division.

45. The apparatus of claim 42, wherein the first and second linear feedback shift register circuits include serially connected latches and XOR gates.

46. The apparatus of claim 42, wherein polynomial division using the first cyclic redundancy code generator polynomial results in a 16-bit cyclic redundancy code and wherein polynomial division using the second cyclic redundancy code generator polynomial results in an 8-bit cyclic redundancy code.

* * * * *